US012557220B2

(12) United States Patent
Guo et al.

(10) Patent No.: US 12,557,220 B2
(45) Date of Patent: Feb. 17, 2026

(54) FUNCTION MODULE AND ELECTRONIC DEVICE INCLUDING THE SAME

(71) Applicant: WISTRON CORP., New Taipei (TW)

(72) Inventors: Minglang Guo, New Taipei (TW); Dun Liu, New Taipei (TW); YuanChang He, New Taipei (TW); Chia-jang Chen, New Taipei (TW)

(73) Assignee: WISTRON CORP., New Taipei (TW)

( * ) Notice: Subject to any disclaimer, the term of this patent is extended or adjusted under 35 U.S.C. 154(b) by 419 days.

(21) Appl. No.: 18/167,115

(22) Filed: Feb. 10, 2023

(65) Prior Publication Data

US 2024/0155768 A1    May 9, 2024

(30) Foreign Application Priority Data

Nov. 9, 2022 (CN) .......................... 202211399262.0

(51) Int. Cl.
*H05K 1/18* (2006.01)
*H05K 5/00* (2006.01)

(52) U.S. Cl.
CPC ............. *H05K 1/18* (2013.01); *H05K 5/0026* (2013.01); *H05K 2201/10128* (2013.01)

(58) Field of Classification Search
CPC ........ H05K 1/0233; H05K 1/14; H05K 1/144; H05K 1/147; H05K 1/165; H05K 2201/042; H05K 2201/052; H05K 2201/10189; H05K 3/361; H05K 5/0017; H05K 5/023; H05K 5/03; H05K 7/1487; H05K 7/1489; H05K 7/1492; H05K 1/0201; H05K 1/0227; H05K 1/0228; H05K 1/0296; H05K 1/18; H05K 2201/09227

USPC ....................................................... 455/575.4
See application file for complete search history.

(56) References Cited

U.S. PATENT DOCUMENTS

2017/0300141 A1* 10/2017 Inoue .................. G06F 3/04886
2020/0004364 A1*  1/2020 Jung .................... H04M 1/0266

FOREIGN PATENT DOCUMENTS

TW          201839490 A      11/2018
TW             I776782 B       9/2022

OTHER PUBLICATIONS

TW Office Action dated Nov. 13, 2023 in Taiwan application No. 111145927.
TW Office Action dated Oct, 16, 2024 in Taiwan application No. 111145927.

* cited by examiner

*Primary Examiner* — Ajibola A Akinyemi
(74) *Attorney, Agent, or Firm* — McClure, Qualey & Rodack, LLP

(57) ABSTRACT

An electronic device includes a device casing, a display panel module disposed on the device casing and having a panel rear side, and a function module disposed between the device casing and the display panel module and comprising a function unit and a fixed bracket, the fixed bracket has a panel attaching surface and an installation surface, the fixed bracket is attached to the panel rear side via the panel attaching surface, the function unit is slidably disposed on the installation surface of the fixed bracket, and the installation surface and the panel attaching surface respectively face different directions.

20 Claims, 11 Drawing Sheets

FUNCTION MODULE AND ELECTRONIC DEVICE INCLUDING THE SAME

CROSS-REFERENCE TO RELATED APPLICATIONS

This non-provisional application claims priority under 35 U.S.C. § 119(a) on Patent Application No(s). 202211399262.0 filed in China on Nov. 9, 2022, the entire contents of which are hereby incorporated by reference.

TECHNICAL FIELD

The disclosure relates to a function module and an electronic device including the same.

BACKGROUND

In recent years, cameras have been widely used in video conferences, live broadcasts, remote video teaching, and other occasions and therefore become an indispensable part of computers or TV screens and have gradually changed people's work and lifestyle.

Typically, the camera lens is arranged in the front bezel of a TV, computer, tablet, or smartphone screen and receives light via a punch-hole on the front bezel. To do so, the front bezel is needed to spare a wide portion to make space for the camera module even if the volume of the camera module is continuously reduced, making the product difficult to achieve an extremely thin bezel.

SUMMARY

Accordingly, one aspect of the disclosure is to provide a function module and an electronic device including the same which enable pop-up camera so that the camera is selectively hidden behind the screen of the electronic device and thereby realizing a narrow outer frame of the screen.

One embodiment of the disclosure provides an electronic device including a device casing, a display panel module disposed on the device casing and having a panel rear side, and a function module disposed between the device casing and the display panel module and comprising a function unit and a fixed bracket, the fixed bracket has a panel attaching surface and an installation surface, the fixed bracket is attached to the panel rear side via the panel attaching surface, the function unit is slidably disposed on the installation surface of the fixed bracket, and the installation surface and the panel attaching surface respectively face different directions One embodiment of the disclosure provides a function module for a display panel module and comprising a function unit and a fixed bracket having a panel attaching surface and an installation surface, the installation surface and the panel attaching surface respectively face different directions, the fixed bracket is attached to a panel rear side of the display panel module via the panel attaching surface and the function unit is slidably disposed on the installation surface of the fixed bracket.

According to the function module and the electronic device as discussed in the above embodiments of the disclosure, the fixed bracket of the function module allows the function unit to be slidably disposed on its installation surface, which makes the function unit able to be arranged behind the screen panel of the electronic device when being employed as a television, computer screen, or smartphone and thereby realizing a narrow outer frame of the screen and pop-up-camera function. As such, the function module of the disclosure is beneficial to significantly reduce the proportion of the screen bezel while realizing a convenient operation.

Also, the function unit is located on the installation surface of the fixed bracket which faces different direction from the panel attaching surface so that the fixed bracket is prevented from covering or limiting the outgoing line from the function unit. As a result, the arrangement of the outgoing line from the function unit is more flexible and therefore can prevent the outgoing line of the function unit from having interfering with or being pulled by the display panel and circuit board module on the display panel when the outgoing line is moved along with the function unit.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein.

DETAILED DESCRIPTION

Aspects and advantages of the disclosure will become apparent from the following detailed descriptions with the accompanying drawings. The inclusion of such details provides a thorough understanding of the disclosure sufficient to enable one skilled in the art to practice the described embodiments but it is for the purpose of illustration only and should not be understood to limit the disclosure. On the contrary, it is intended to cover alternatives, modifications, and equivalents as can be included within the spirit and scope of the described embodiments as defined by the appended claims. To this end, those skilled in the relevant art will recognize and appreciate that many changes can be made to the various aspects of the disclosure described herein, while still obtaining the beneficial results of the present disclosure. It will also be apparent that some of the desired benefits of the present disclosure can be obtained by selecting some of the features of the present disclosure without utilizing other features.

It is to be understood that the phraseology and terminology used herein are for the purpose of better understanding the descriptions and should not be regarded as limiting. Unless specified or limited otherwise, the terms "mounted," "connected," and variations thereof are used broadly and encompass both direct and indirect mountings and connections. As used herein, the terms "substantially" or "approximately" may describe a slight deviation from a target value, in particular a deviation within the production accuracy and/or within the necessary accuracy, so that an effect as present with the target value is maintained. Unless specified or limited otherwise, the phrase "at least one" as used herein may mean that the quantity of the described element or component is one or more than one but does not necessarily mean that the quantity is only one. The term "and/or" may be used herein to indicate that either or both of two stated possibilities.

Figure 1:
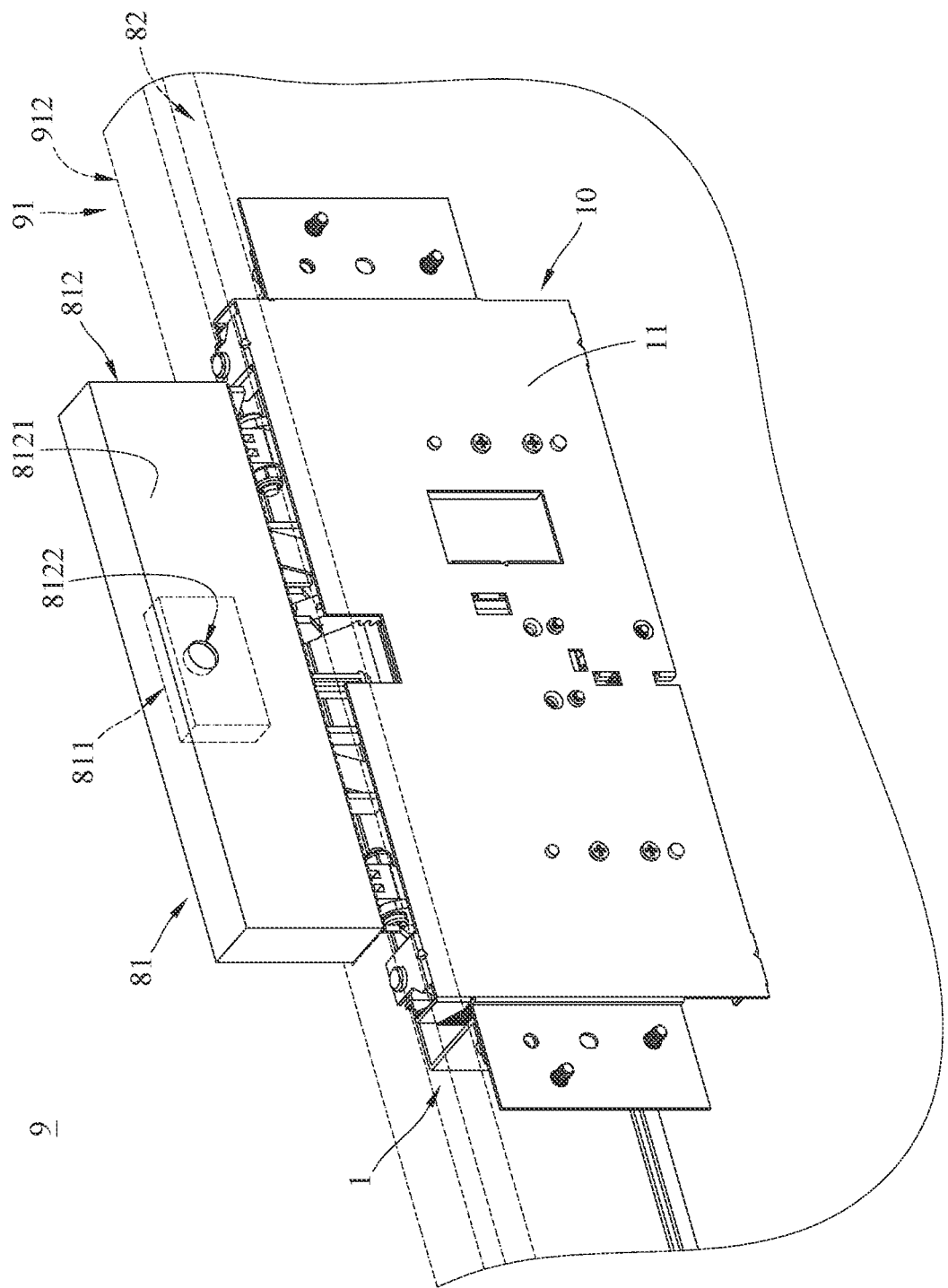
FIGS. 1-2 is a perspective view of an electronic device with a function module according to one embodiment of the disclosure.
Figure 2:
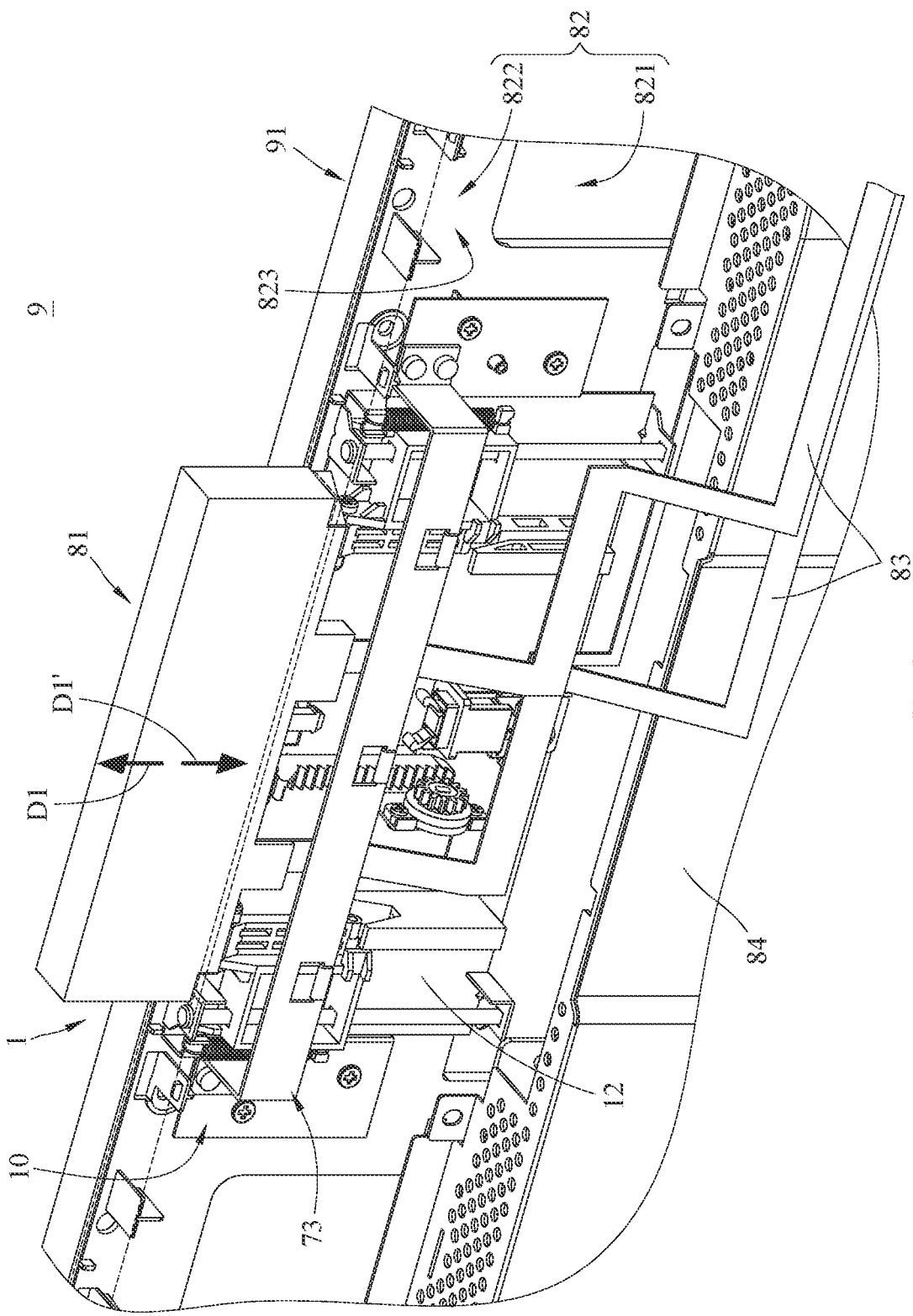
Figure 3:
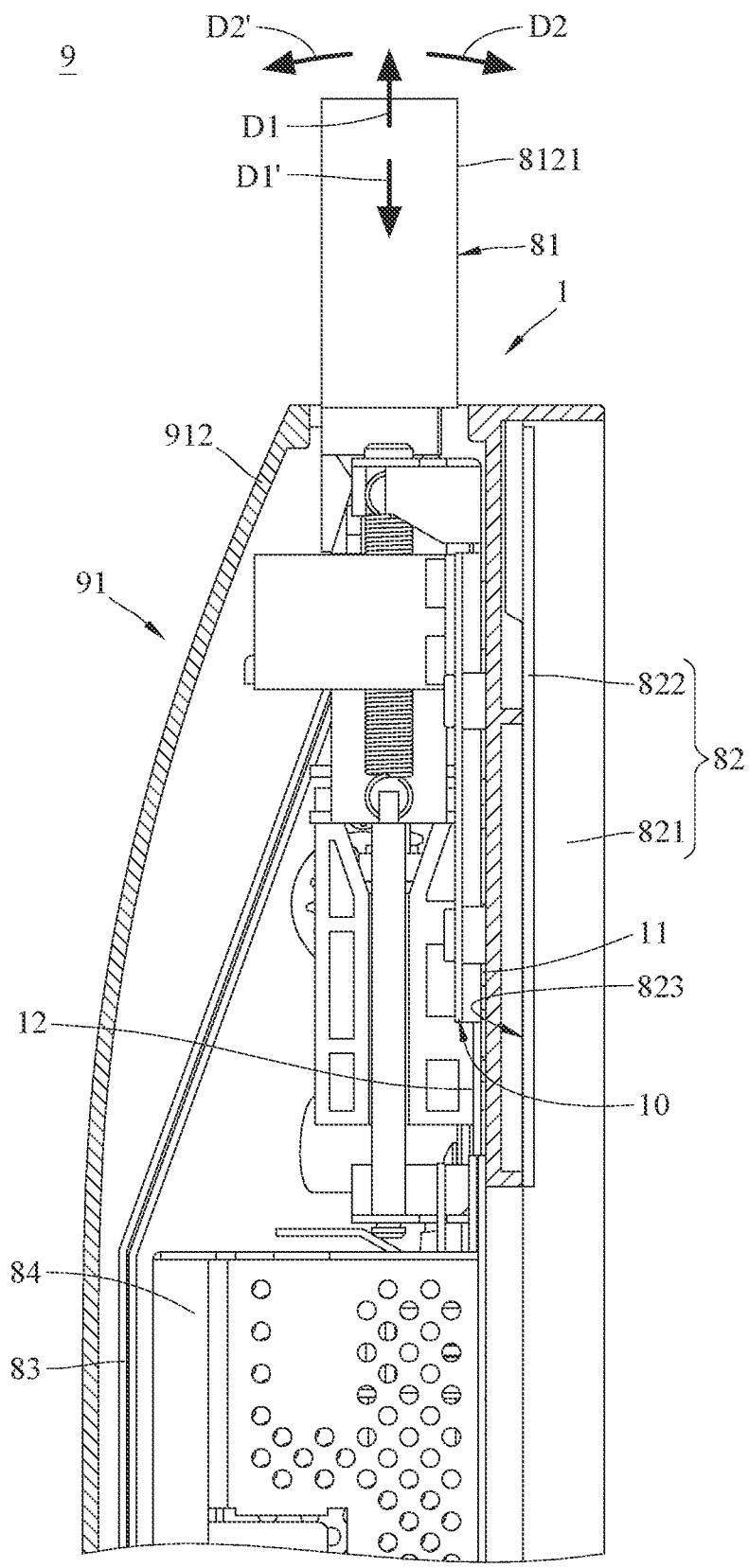
FIG. 3 is a partially-enlarged cross-sectional side view of the electronic device in FIG. 1.
Figure 4:
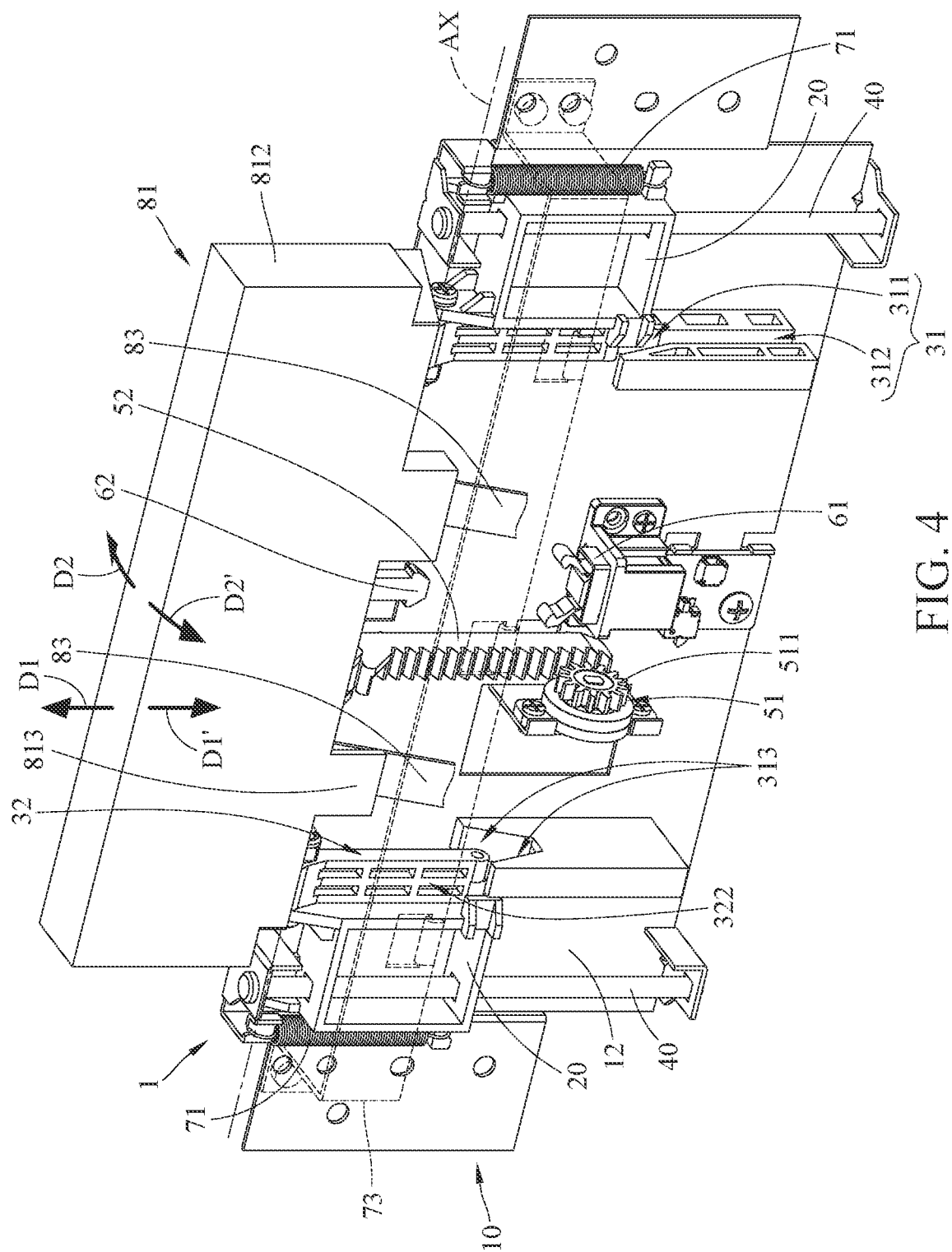
FIG. 4 is a perspective view of the function module in FIG. 2.
Figure 5:
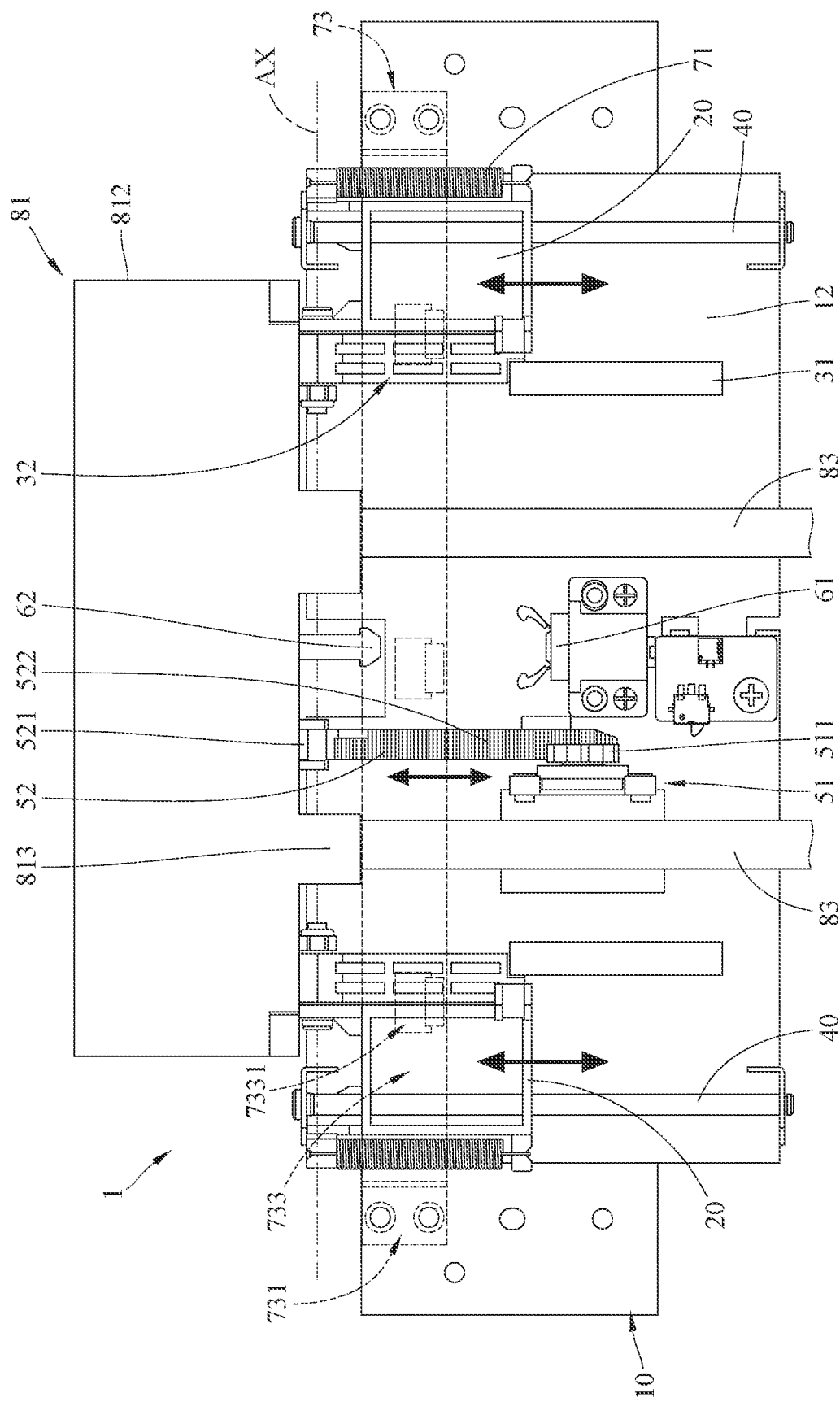
FIG. 5 is a front view of the function module in FIG. 4.
Figure 6:
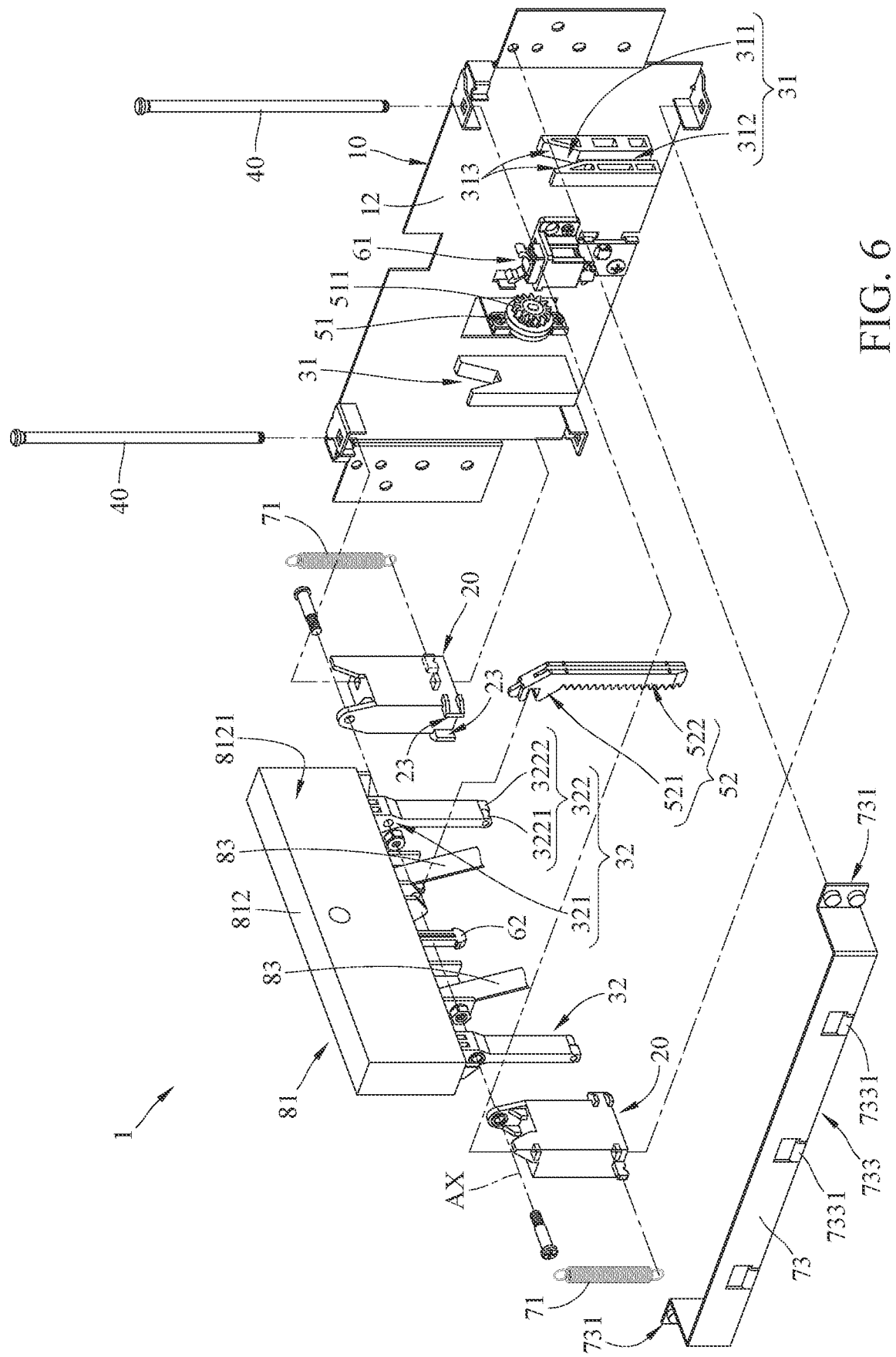
FIG. 6 is an exploded view of the function module in FIG. 4.
Figure 7:
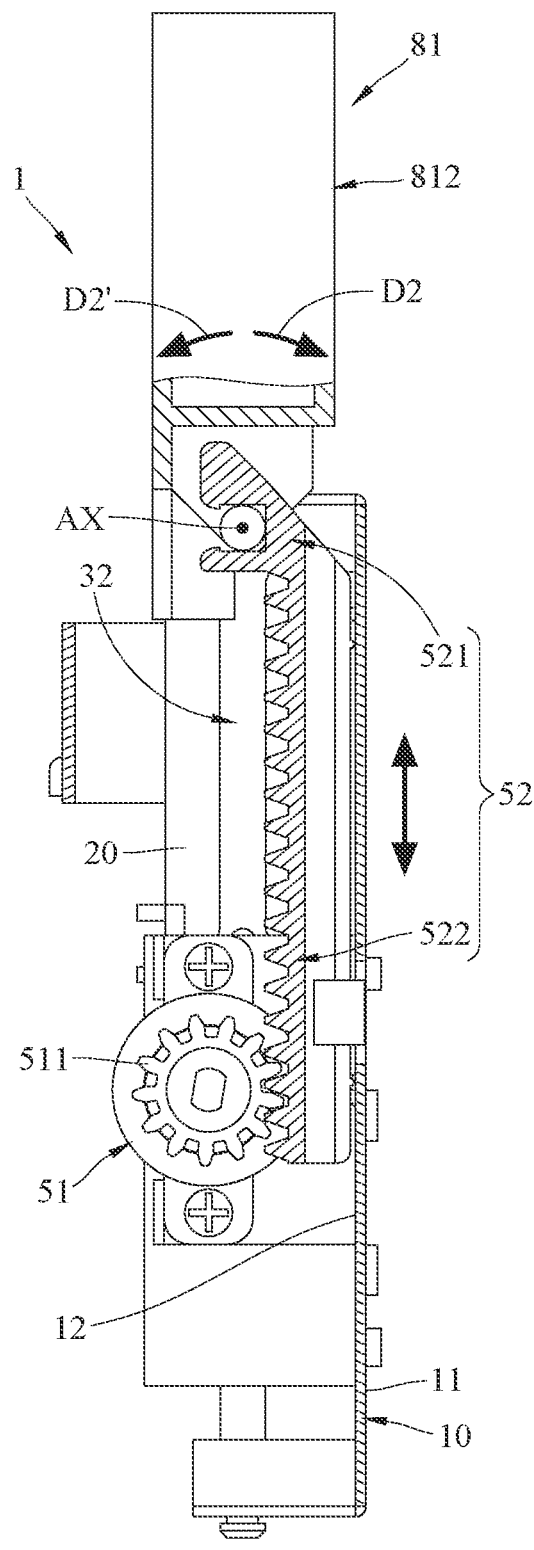
FIGS. 7-8 are cross-sectional side views of the function module in FIG. 4, taken from different planes.
Figure 8:
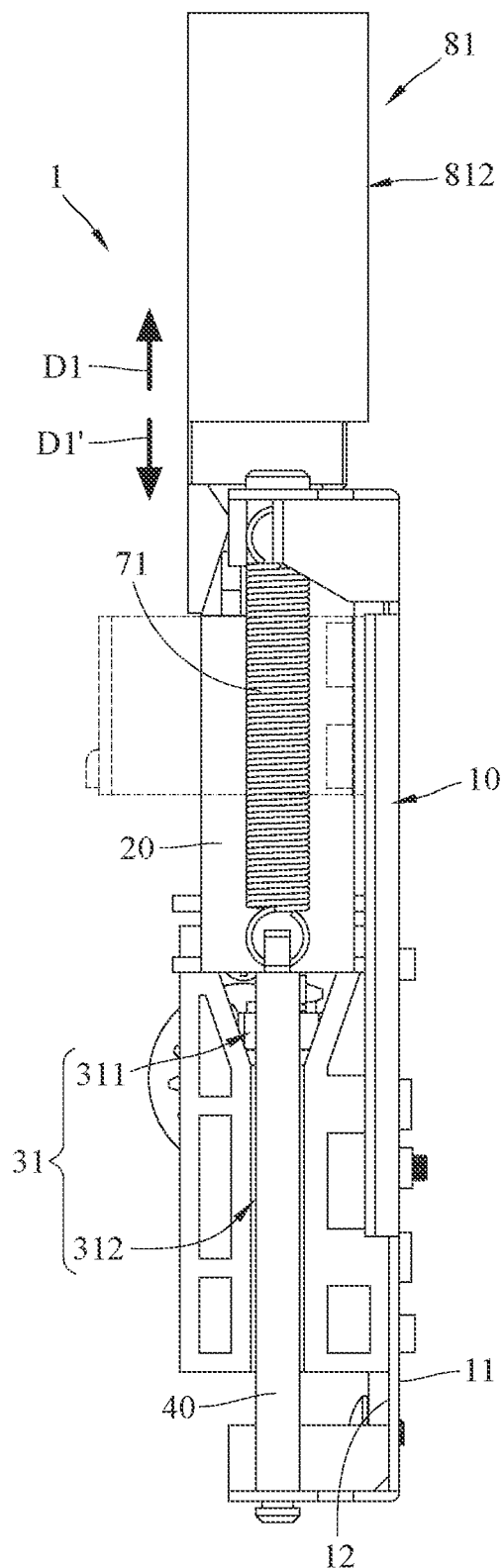

Firstly, referring to FIGS. 1-3, one embodiment of the disclosure provides an electronic device 9 with a function module 1. Note that at least part of the electronic device 9 are illustrated in dash-lines for better reviewing the internal of the electronic device 9. The electronic device 9 may be, but is not limited to be, employed as a television, computer screen, smartphone, or projector.

The electronic device 9 may include a device casing 91. The device casing 91 is provided for accommodating the function module 1 and any other required electrical and non-electrical component, structure, or module. The function module 1 may include a fixed bracket 10. The fixed bracket 10 is the part of the function module 1 used for supporting the other component or structure of the function module 1. There may be a function unit 81 disposed on the fixed bracket 10. The function unit 81 may include an electrical component 811 and an accommodation casing 812. The electrical component 811 may, but is not limited to, have function, such as audio-receiving, infrared sensing, or image capturing. The electrical component 811 may be accommodated in the accommodation casing 812 and therefore is disposed on the function module 1 via the accommodation casing 812.

The accommodation casing 812 may have a front surface 8121 and a through hole 8122 formed on the front surface 8121. The front surface 8121 herein means the surface (or, side) of the function unit 81 that faces toward the user during the normal usage of the electronic device 9. The through hole 8122 is served as a channel which exposes the electrical component 811 to allow the electrical component 811 to capture external light, audio, signals.

Optionally, the electronic device 9 may further include a display panel module 82, the display panel module 82 may be disposed within the device casing 91 of the electronic device 9. Specifically, the device casing 91 of the electronic device 9 may include a rear casing member 912, the function module 1 may be arranged between the display panel module 82 and the rear casing member 912 of the device casing 91. In this embodiment, the display panel module 82 may include a display panel 821 and a panel frame 822. The display panel 821 means the part of the electronic device 9 used to display image. Note that any panel that can display images can be employed as the display panel 821 of the disclosure. The panel frame 822 (may also be called "middle frame") means the structure in the electronic device 9 that is used to be accommodated in the device casing 91 and used for fixation of the display panel 821 in the required position; that is, the display panel 821 may be disposed on the panel frame 822 and may be installed on the device casing 91 via the panel frame 822. Note that any structure that can realize the aforementioned functions of the panel frame 822 is suitable for being employed as the panel frame 822 of the disclosure.

As shown, the display panel module 82 may have a panel rear side 823, the panel rear side 823 means the side (or, surface) of the display panel 821 and/or panel frame 822 that faces toward the rear casing member 912 of the device casing 91. The fixed bracket 10 of the function module 1 may be disposed on the panel rear side 823 of the display panel module 82 via any suitable means, such as screw, rivet, or adhesive, such that the function module 1 is disposed between the panel rear side 823 of the display panel module 82 and the rear casing member 912.

In this embodiment, the function unit 81 is movably disposed on the fixed bracket of the function module 1 and therefore is movably accommodated between the display panel module 82 and the rear casing member 912 of the device casing 91. The fixed bracket of the function module 1 may have a panel attaching surface 11 and an installation surface 12. The panel attaching surface 11 and the installation surface 12 respectively are two opposite sides of the fixed bracket 10. The panel attaching surface 11 means the surface of the fixed bracket 10 that is used to contact or face toward the panel rear side 823 of the display panel module 82. In some embodiments, the fixed bracket 10 is attached to the panel rear side 823 of the panel frame 822 of the display panel module 82 via the panel attaching surface 11. The installation surface 12 means the surface of the fixed bracket 10 that faces toward the rear casing member 912 of the device casing 91 and is used for the installation of the function unit 81 and other components of the function module 1; in other words, in this embodiment, the function unit 81 is slidably located on the installation surface 12 of the fixed bracket 10.

As can be seen from FIGS. 1-2, the front surface 8121 of the function unit 81 in which the through hole 8122 is formed and the panel attaching surface 11 of the fixed bracket may substantially face toward similar or the same direction, and the front surface 8121 of the function unit 81 and the installation surface 12 of the fixed bracket 10 may substantially face toward opposite directions. The front surface 8121 of the function unit 81 faces toward the installation surface 12 of the fixed bracket 10. Please see FIG. 3, an enlarged cross-sectional side view of the electronic device 9 is provided, as shown, the function unit 81 is slidable relative to the installation surface 12 of the fixed bracket 10, the installation surface 12 of the fixed bracket 10 and the panel attaching surface 11 respectively face different directions (e.g., opposite directions), thus the panel attaching surface 11 of the fixed bracket faces toward the user and the function unit 81 is slidably located on the installation surface 12 of the fixed bracket 10 during the normal usage of the electronic device 9.

Figure 12:
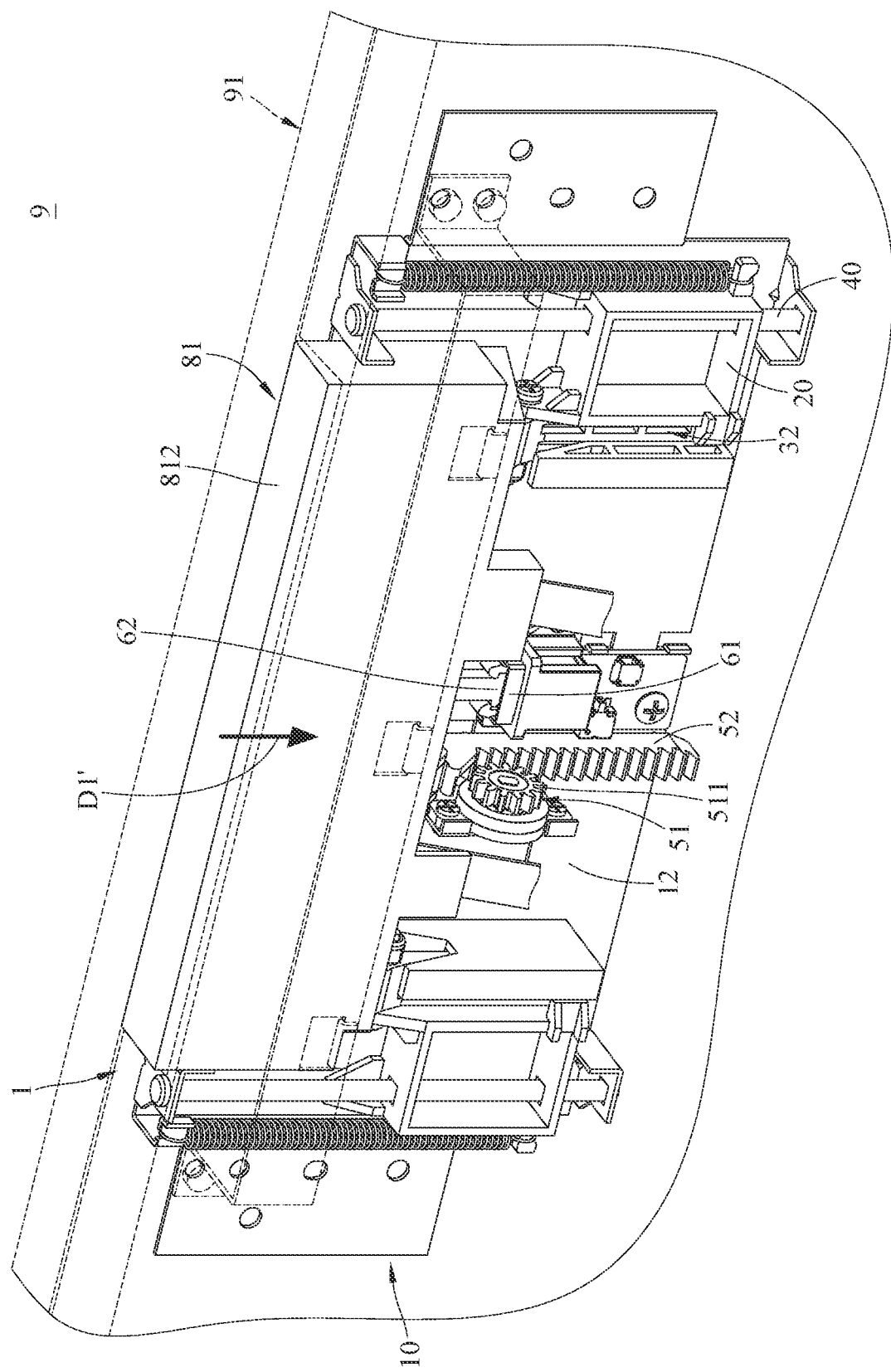
FIG. 12 is a perspective view of the function module in FIG. 4 when the function unit is in the hidden position.
Figure 13:
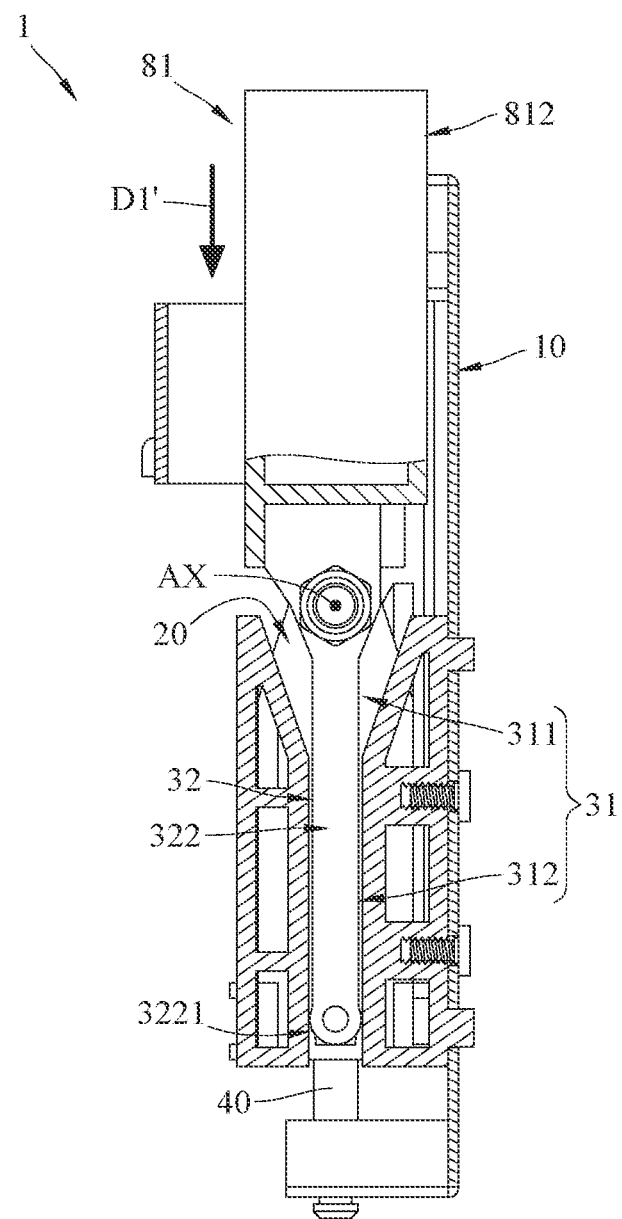
FIG. 13 is a cross-sectional side view of the function module in FIG. 12 when the function unit is in the hidden position.

In this embodiment, by the function module 1, the function unit 81 may be selectively moved along a slidable direction D1' to be hidden within the device casing 91 (as shown in, for example, FIGS. 12-13). When the function unit 81 is in the device casing 91, the function unit 81 is in a hidden position. Selectively, the function unit 81 may be moved along a slidable direction D1 to stick out from the device casing 91 by being driven by the function module 1 (as shown in, for example, FIGS. 1-3). When the function unit 81 sticks out of the device casing 91, the function unit 81 is in a pop-up position.

Optionally, the electronic device 9 may further include a circuit board module 84, the circuit board module 84 may be arranged at the panel rear side 823 of the display panel module 82, that is, the circuit board module 84 and the function module 1 may be arranged at the same side of the display panel module 82. Further, the circuit board module 84 may be located adjacent to a side of the function module 1. There may be chip, capacitor, inductor, or other electrical elements (not shown) that can enable required functions arranged on the circuit board module 84. As the slidable directions D1 and D1' shown in the drawings, the function module 1 allows the function unit 81 to selectively move toward or away from the circuit board module 84.

The electronic device 9 may further include one or more cables 83, the cable 83 is electrically connected between the function unit 81 and the circuit board module 84. At least part of the cable 83 is movable relative to the circuit board module 84 by being moved by the function unit 81. Specifically, the part of the cable 83 that is located closer to the function unit 81 may have greater deformation due to the motion of the function unit 81. Optionally, the accommodation casing 812 of the function unit 81 may have one or more cable outlet structures 813 protruding therefrom. Specifically, the cable outlet structures 813 may protrude from the side of the accommodation casing 812 which is located closer to the circuit board module 84, the cables 83 pass through the cable outlet structures 813 and extend toward the predetermined direction from the function unit 81.

Specifically, in this embodiment, the cable 83 extends out from the function unit 81, the installation surface 12 of the fixed bracket 10 faces toward the rear casing member 912 of the device casing 91 and the function unit 81 is slidably located on the installation surface 12 of the fixed bracket 10, thus the fixed bracket 10 will not limit the arrangement and movement of the cable 83 and can be arranged toward the direction away from the installation surface 12 of the fixed bracket 10. As shown in FIG. 3, the cable 83 extends out from the function unit 81 and can be arranged in the space between the circuit board module 84 and the rear casing member 912 of the device casing 91. Compared to the prior art that the cable has to be prearranged between the display panel and the circuit board module, the function module 1 enables a flexible arrangement of the cable 83 of the function unit 81 so as to prevent the cable from having interference with the display panel and the circuit board module when being pulled by the function unit.

The further detail of the function module 1 are provided with reference to FIGS. 4-8. In this embodiment, the function module 1 may further include at least one slidable structure 20, at least one guiding structure 31, at least one angle-positioning structure 32, and at least one guiding rod 40 which are disposed on the fixed bracket 10; specifically, the slidable structure 20, the guiding structure 31, the angle-positioning structure 32, and the guiding rod 40 are all disposed on or above the installation surface 12 of the fixed bracket 10.

In this embodiment, the function module 1 may include two slidable structures 20, two guiding structures 31, two angle-positioning structures 32, and two guiding rods 40 which are divided into two group respectively arranged at two opposite sides of the fixed bracket 10, but the disclosure is not limited thereto. In some other embodiments, there may be only one slidable structure, one guiding structure, one angle-positioning structure, and one guiding rod in the function module.

The guiding rods 40 may be arranged on the fixed bracket 10 by any suitable manner. The guiding rods 40 may be separated from each other by any suitable distance. The slidable structures 20 are slidably sleeved on the guiding rods 40, respectively; in other words, the guiding rods 40 are disposed through the slidable structures 20, respectively. Thus, the slidable structures 20 are movable along the guiding rods 40, and the extension direction of the guiding rods 40 limit the slidable direction of the slidable structures 20 (i.e., the direction D1 or D1'). The slidable structures 20 on the fixed bracket 10 are spaced apart from each other, thus the slidable structures 20 spare a space therebetween on the side of the installation surface 12 of the fixed bracket 10 available for the guiding structures 31, the angle-positioning structures 32, and other relevant components.

The slidable structures 20 may be connected to the function unit 81. When the slidable structures 20 slide along the slidable direction (D1 or D1') (or, when the slidable structures 20 slide along the extension direction of the guiding rods 40), the function unit 81 is moved with the slidable structures 20 along the slidable direction of the slidable structure or the extension direction of the guiding rod 40. As such, the guiding rods 40 define the slidable direction of the function unit 81 (i.e., D1 or D1'). Further, in this embodiment, the slidable structures 20 may be pivotally connected to an accommodation casing 812 of the function unit 81, thus the function unit 81 is rotatably or pivotable about an axis AX relative to the fixed bracket 10 and the slidable structure 20 (as the pivoting directions D2 and D2' shown in the drawings).

The guiding structure 31 may be a slot with an opening facing toward the function unit 81. Specifically, the guiding structure 31 may include a guiding opening portion 311 and a guiding slot portion 312 which are connected to each other. The guiding opening portion 311 is located between the function unit 81 and the guiding slot portion 312. The guiding opening portion 311 is tapered toward the guiding slot portion 312; in other words, the guiding opening portion 311 is tapered toward away from the function unit 81. Specifically, the guiding structure 31 may include two inclined guide surfaces 313 which define the guiding opening portion 311. More specifically, in this embodiment, the inclined guide surfaces 313 are two slopes on imaginary planes (not shown) which do not overlap the axis AX of the function unit 81. The guiding slot portion 312 may be substantially parallel to the guiding rod 40; that is, the guiding slot portion 312 may be substantially parallel to the slidable directions D1 and D1' of the slidable structure 20 (i.e., the extension direction of the guiding rod 40).

The angle-positioning structure 32 may be connected to the function unit 81. For example, in some embodiments, the angle-positioning structure 32 may be integrally formed with the accommodation casing 812 of the function unit 81; specifically, the angle-positioning structure 32 may be a protrusion integrally formed on a side of the accommodation casing 812 of the function unit 81 which is located closer to the guiding structure 31. Thus, the angle-positioning structure 32 may be rotatably or pivotable about the axis AX with the function unit 81 and/or be movable along the slidable direction D1 or D1' of the slidable structure 20 (i.e., the extension direction of the guiding rod 40) with the slidable structure 20.

The angle-positioning structure 32 may include a connecting portion 321 and an extension arm portion 322 which are connected to each other. The angle-positioning structure 32 is connected to the function unit 81 via the connecting portion 321. The connecting portion 321 of the angle-positioning structure 32, the accommodation casing 812 of the function unit 81, and the slidable structures 20 are coaxial to one another (i.e., the axis AX). The extension arm portion 322 may be connected to the accommodation casing 812 of the function unit 81 via the connecting portion 321. The extension arm portion 322 means the part of the angle-positioning structure 32 which is suitably inserted into the guiding structure 31. As such, while the function unit 81 is pivoting about the axis AX relative to the slidable structure 20, the extension arm portion 322 of the angle-positioning structure 32 is pivoting about the axis AX.

The extension arm portion 322 may include an angle-adjusting surface 3221 and two contact surfaces 3222. The contact surfaces 3222 are located opposite to each other and may be located on a distal end of the extension arm portion 322 which is located away from the connecting portion 321. The angle-adjusting surface 3221 may be a curved surface used to selectively contact or press against one of the inclined guide surfaces 313 of the guiding structure 31 or inner surface of the guiding slot portion 312. The contact surface 3222 may be an inclined surface used to selectively contact or press against the slidable structure 20.

Specifically, the slidable structure 20 may have two stopping surfaces 23 which face toward each other. One of the stopping surfaces 23 faces toward the fixed bracket 10, the other stopping surface 23 faces the opposite surface that is away from the fixed bracket 10. While the function unit 81 is in the pop-up position and pivoting about the axis AX, the contact surfaces 3222 on the extension arm portion 322 of the angle-positioning structure 32 are movable between the stopping surfaces 23 to selectively contact one of the stopping surfaces 23, thus the stopping surfaces 23 are able to limit the pivotable range that the angle-positioning structure 32 pivots about the axis AX so as to limit the maximum angle that the function unit 81 pivots about the axis AX.

When the function unit 81 is in an angle to the slidable direction D1' and moved toward the hidden position from the pop-up position, the angle-adjusting surface 3221 on the extension arm portion 322 of the angle-positioning structure 32 selectively contact one of the inclined guide surfaces 313 of the guiding opening portion 311, the inclined guide surface 313 can guide the extension arm portion 322 of the angle-positioning structure 32 into the guiding slot portion 312 of the guiding structure 31, such that the extension arm portion 322 is inserted into the guiding slot portion 312 to ensure that the angle-positioning structure 32 to move along the guiding rod 40 with the slidable structures 20. During such movement, the function unit 81 is pivoted to vertical position; in other words, the function unit 81 is pivoted to a position which is parallel to its slidable direction. As such, the angle-adjusting surface 3221 may contact the inner surface of the guiding slot portion 312 to guide the function unit 81 into the device casing 91.

Optionally, the function module 1 may further include a gear damper 51 and a toothed rail 52. Any suitable gear damper may be employed as the gear damper 51 of the disclosure. As shown, the gear damper 51 may have a gear member 511 rotatably disposed on the fixed bracket 10. The toothed rail 52 is slidably disposed on the fixed bracket 10 and may include a distal portion 521 and a toothed portion 522. The distal portion 521 means the part of the toothed rail 52 which is directly pivotably connected to the accommodation casing 812 of the function unit 81. As shown, the distal portion 521 of the toothed rail 52 is coaxial with the function unit 81 about the axis AX, in other words, the toothed rail 52 and the function unit 81 share the same axis. Thus, the toothed rail 52, the function unit 81, and the angle-positioning structure 32 and the slidable structures 20 which are connected to the function unit 8 are coaxial to one another. As such, the function unit 81 is allowed to pivot relative to the toothed rail 52 so as to prevent the movement of the function unit 81 from affecting the engagement between the gear damper 51 and the toothed rail 52. The toothed portion 522 means the part of the toothed rail 52 that have teeth thereon and are used to mesh with the gear member 511 of the gear damper 51. As shown, the extension direction of the toothed portion 522 may be substantially parallel to the slidable direction D1, D1' of the slidable structure 20 (i.e., the extension direction of the guiding rod 40). The engagement between the toothed rail 52 and the gear damper 51 is able to stabilize the movement of the function unit 81 along the slidable direction of the slidable structure 20 (i.e., the extension direction of the guiding rod 40).

Optionally, there may be an elongated recess and mating protrusion (not numbered) which are engaged with each other and respectively located on the toothed portion 522 and the installation surface 12 of the fixed bracket 10 so as to ensure that the toothed portion 522 is only movable along the slidable direction D1, D1' of the slidable structure 20 (i.e., the extension direction of the guiding rod 40). Optionally, in this embodiment, the gear member 511 of the gear damper 51 may be arranged at an angle perpendicular to the fixed bracket 10, such that the gear damper 51 occupies less lateral space between the slidable structures 20 and is prevented from having interference with the cable 83.

Optionally, the function module 1 may further include a retainer 61 and a latch 62. The retainer 61 may be any suitable push-push locking mechanism which is characterized by being activated by applying a force in the same direction when locking or releasing a device. The latch 62 is disposed on the function unit 81. For example, in some embodiments, the latch 62 may be a protrusion with required shape and integrally formed with the accommodation casing 812 of the function unit 81; specifically, the latch 62 may protrude from the side of the accommodation casing 812 of the function unit 81 which is located closer to the guiding structure 31 and the distal portion of the latch 62 may have an arrow shape suitable to be releasably inserted into the retainer 61. When the latch 62 is inserted into the retainer 61, the engagement between the latch 62 and the retainer 61 secures the function unit 81 in the hidden position, such that the slidable structures 20, the angle-positioning structures 32, and the toothed rail 52 which are connected to the function unit 81 are retained at the current position and status by the retainer 61.

Optionally, function module 1 may further include at least one elastic component 71. Any suitable extension spring may be employed as the elastic component 71 of the disclosure. The elastic component 71 may be connected between the fixed bracket 10 and one of the slidable structures 20 and used to force the slidable structure 20 to move away from the circuit board module 84. Note that any suitable compression spring may also be employed as the elastic component of the disclosure; in such a case, the elastic component may be arranged at another side of the slidable structure that makes the elastic component able to force the slidable structure to move away from the circuit board module.

Optionally, the function module 1 may further include at least one spanning member 73. The spanning member 73 may be fixed on the installation surface 12 of the fixed bracket 10 via any suitable means. The spanning member 73 may cross and partially cover the space which is spared by the slidable structures 20. Thus, the function unit 81 is able to selectively slide between the spanning member 73 and the installation surface 12 of the fixed bracket 10.

The spanning member 73 may include two mount portions 731 and a spanning portion 733 connected between the mount portions 731. The mount portions 731 mean the parts of the spanning member 73 which are directly fixed to the fixed bracket 10. The spanning portion 733 means the part of the spanning member 73 which crosses and partially covers the space between the slidable structures 20. Optionally, the spanning portion 733 may have one or more installation structures 7331. The installation structures 7331 mean the parts of the spanning portion 733 which are used to be directly or indirectly engaged with the rear casing member 912 of the device casing 91. For example, in some embodiments, the installation structures 7331 may be a bent tab suitably engaged with the rear casing member 912. Thus, the spanning member 73 can be fixed to the fixed bracket 10 via the mount portions 731 and fixed to the rear casing member 912 of the device casing 91 via the installation structures 7331. As such, the spanning member 73 is able to transmit the force existing on or applied to the device casing 91 to the fixed bracket 10 instead of directly transmitting to the components and structures of the function module 1 that involve the movement of the function unit 81, thereby preventing external force from affecting the operation of the function module 1.

The operation of the function module 1 will be described in detail with reference to FIGS. 9-13. Firstly, in FIGS. 9-10, when the function unit 81 is in the pop-up position and sticks out from the device casing 91, the function unit 81 is allowed to pivot in the direction D2 or D2', meanwhile, the force that the elastic components 71 of the function module 1 exert on the slidable structures 20 keeps the function unit 81 and the latch 62 on the function unit 81 away from the retainer 61, such that the extension arm portion 322 of the angle-positioning structure 32 are kept away from the guiding slot portion 312 of the guiding structure 31.

Figure 9:
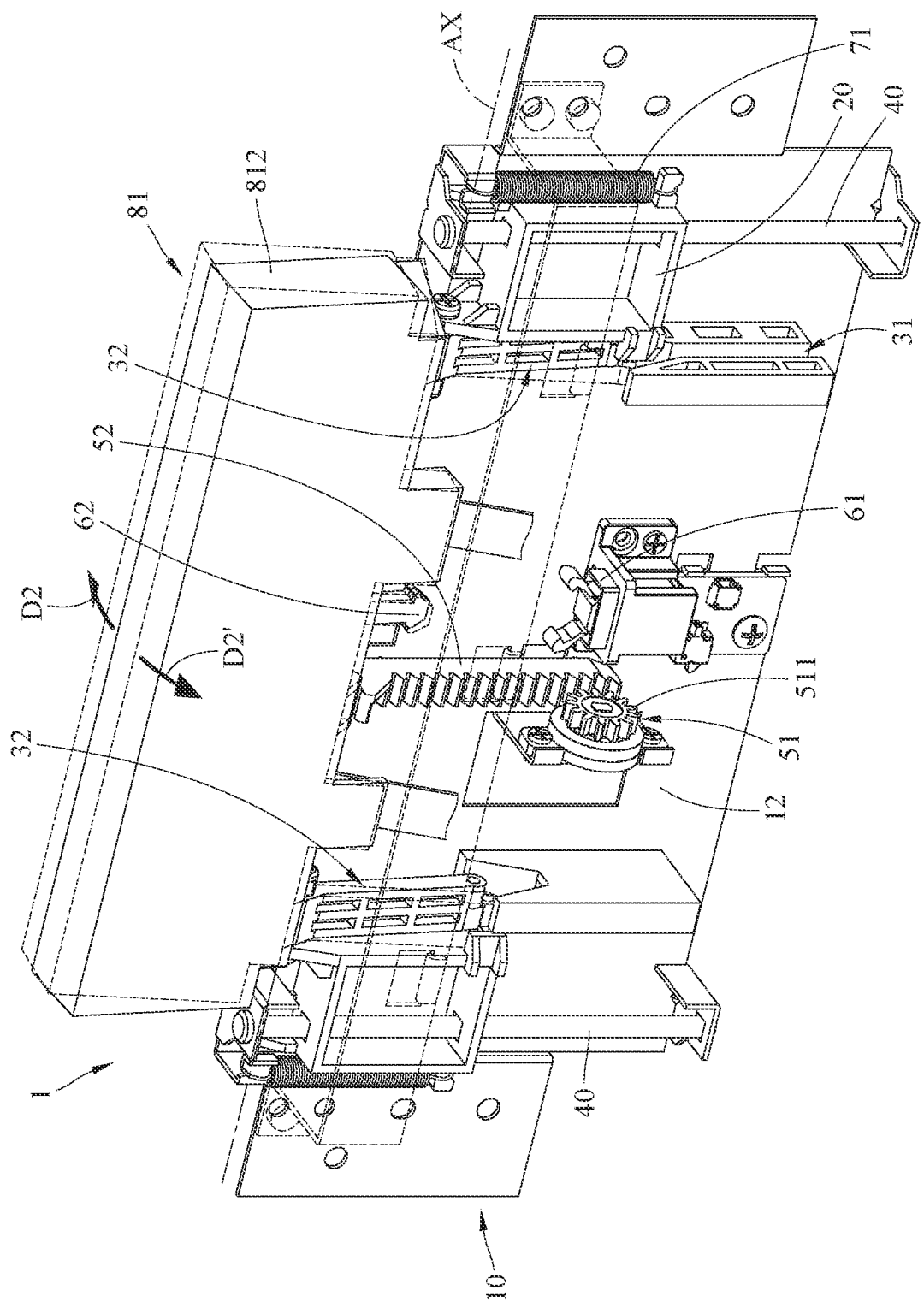
FIG. 9 depicts angle adjustment of the function unit in FIG. 4.
Figure 10:
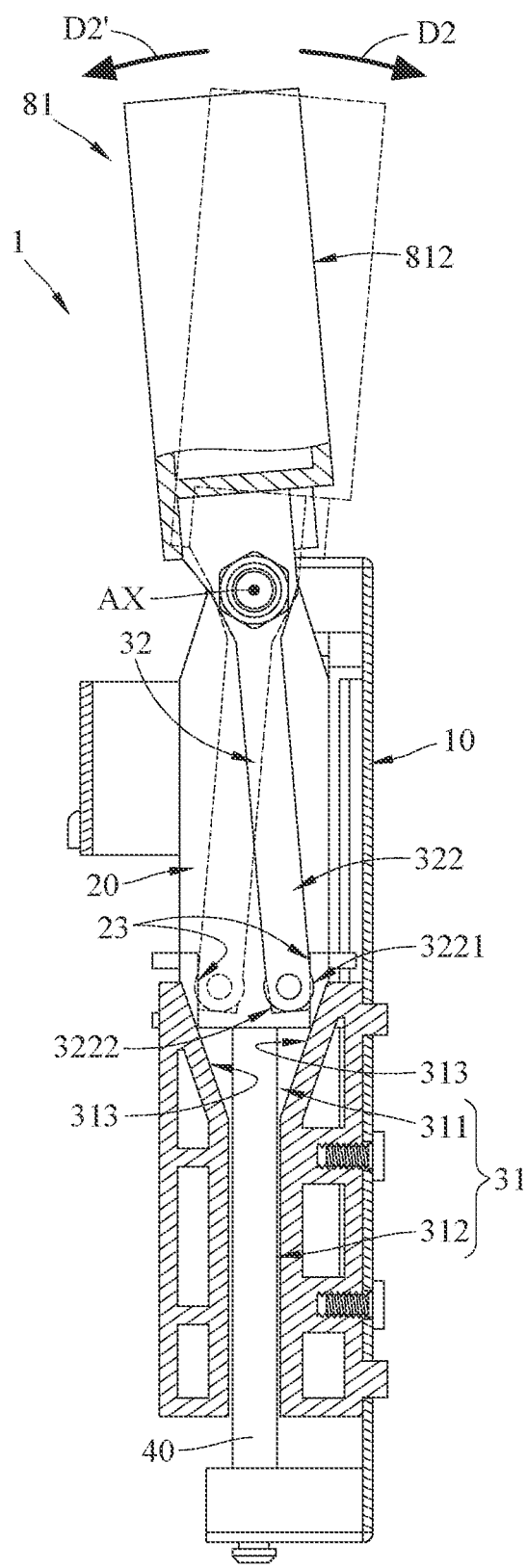
FIG. 10 is a cross-sectional side view of the function module in FIG. 9.

Specifically, in FIGS. 9 and 10, the angle-adjusting surface 3221 and the contact surfaces 3222 on the distal end of the extension arm portion 322 of the angle-positioning structure 32 may be located at guiding opening portion 311 of the guiding structure 31 so that the angle-adjusting surface 3221 is located between the inclined guide surfaces 313 and the contact surfaces 3222 are located between the stopping surfaces 23 of the slidable structure 20.

At this moment, the function unit 81 and the angle-positioning structure 32 thereon are not yet limited by the guiding slot portion 312 of the guiding structure 31 and the retainer 61, thus the function unit 81 and the angle-positioning structure 32 are allowed to pivot about the axis AX (as indicated by the pivoting direction D2 or D2'). During the pivoting movement of the function unit 81, the stopping surfaces 23 limit the maximum angle that the function unit 81 and the angle-positioning structure 32 can pivot about the axis AX since the contact surfaces 3222 of the angle-positioning structure 32 are located between the stopping surfaces 23 of the slidable structure 20; and the inclined guide surfaces 313 also help to limit the maximum angle that the function unit 81 of the pop-up position can pivot about the axis AX since the angle-adjusting surface 3221 of the angle-positioning structure 32 is located between the inclined guide surfaces 313.

Figure 11:
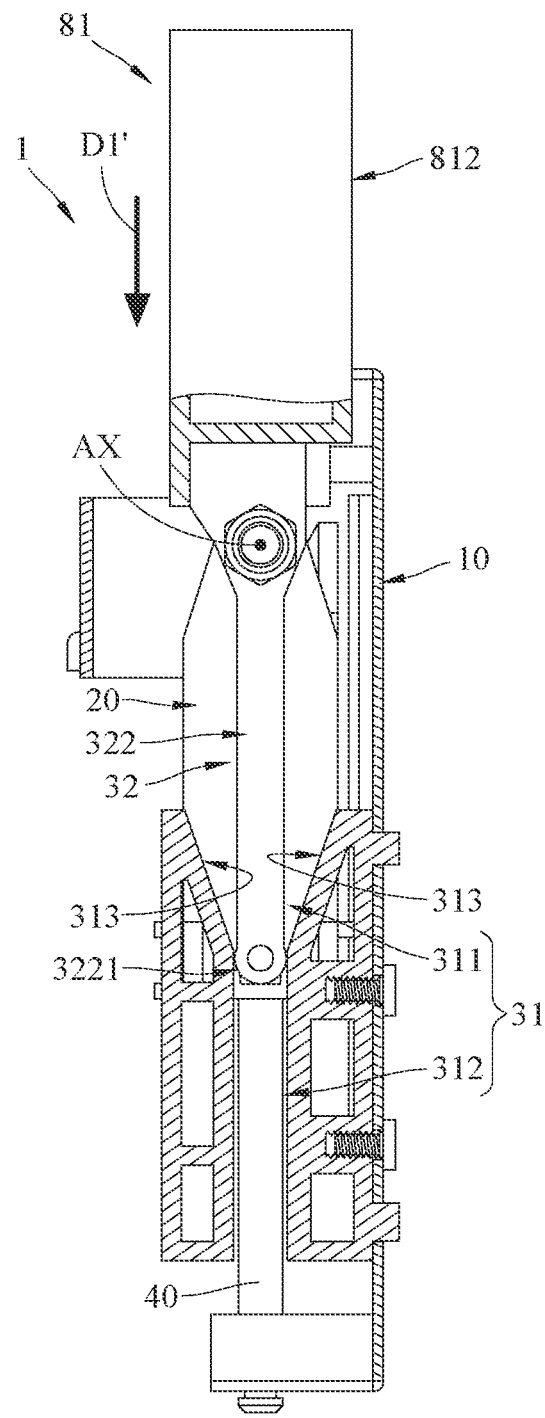
FIG. 11 is a cross-sectional side view of the function module in FIG. 4 when the function unit in vertical position.

Then, in FIGS. 10-11, the function unit 81 can be pushed toward the retainer 61 whether the function unit 81 is at an angle to the extension direction of the guiding rod 40. By doing so, the contact between the angle-adjusting surface 3221 of the angle-positioning structure 32 and the inclined guide surfaces 313 of the guiding structure 31 may automatically position the extension arm portion 322 to be parallel to the extension direction of the guiding rod 40 so as to facilitate the extension arm portion 322 of the angle-positioning structure 32 to enter the guiding slot portion 312 of the guiding structure 31. As such, the function unit 81 will be automatically positioned to the position shown in FIG. 11 during the insertion of the extension arm portion 322 of the angle-positioning structure 32 into the guiding slot portion 312 of the guiding structure 31.

Then, in FIGS. 12-13, when the function unit 81 is pushed to the hidden position and submerged in the device casing 91, the latch 62 on the function unit 81 is engaged with the retainer 61 on the fixed bracket 10, such that the function unit 81, the slidable structure 20, the angle-positioning structure 32, and the toothed rail 52 are all secured in the current position and status by the retainer 61. Meanwhile, the elastic component 71 is elastically deformed by the movement of the slidable structure 20 relative to the fixed bracket 10 and therefore stores energy used to return the function unit 81 back to the pop-up position. When it is attempted to switch the function unit 81 back to the pop-up position from the hidden position, it only needs to push the function unit 81 again to make the retainer 61 release the latch 62. When the retainer 61 releases the latch 62, the elastic component 71 forces the function unit 81 and the angle-positioning structure 32 and the latch 62 which are connected to the function unit 81 to move back to the status shown in FIG. 9 by exerting force on the slidable structure 20.

As discussed, the slidable structures 20 which guide the movement of the function unit 81 are spaced apart from each other by a space used for the arrangement of the function module 1 and the cable 83, which is not only favorable for the size reduction of the function module 1 in lateral direction (or, transverse direction) but also favorable for arranging the cable 83 toward the space between the circuit board module 84 and the rear casing member 912 of the device casing 91. As shown in FIG. 3, at least part of the cable 83 is selectively located between the circuit board module 84 and the rear casing member 912 of the device casing 91. Compared to the prior arm that the cable has to be prearranged between the display panel and the circuit board module, the function module 1 enables a flexible arrangement of the cable 83 of the function unit 81 and therefore can prevent the cable 83 from having interference with the display panel module 82 and the circuit board module 84 when being moved by the function unit 81.

According to the function modules and the electronic devices as discussed in the above embodiments of the disclosure, the fixed bracket of the function module allows the function unit to be slidably disposed on its installation surface, which makes the function unit able to be arranged behind the screen panel of the electronic device when being employed as a television, computer screen, or smartphone and thereby realizing a narrow outer frame of the screen and pop-up-camera function. As such, the function module of the disclosure is beneficial to significantly reduce the proportion of the screen bezel while realizing a convenient operation.

Also, the function unit is located on the installation surface of the fixed bracket which faces different direction from the panel attaching surface so that the fixed bracket is prevented from covering or limiting the outgoing line from the function unit. As a result, the arrangement of the outgoing line from the function unit is more flexible and therefore can prevent the outgoing line of the function unit from having interfering with or being pulled by the display panel and circuit board module on the display panel when the outgoing line is moved along with the function unit.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. An electronic device, comprising:
   a device casing;
   a display panel module disposed on the device casing and having a panel rear side; and
   a function module disposed between the device casing and the display panel module and comprising:
   a function unit;
   a fixed bracket having a panel attaching surface and an installation surface; and
   a spanning member, fixed to the installation surface of the fixed bracket;
   the fixed bracket being attached to the panel rear side via the panel attaching surface, the function unit being slidably disposed between the installation surface of the fixed bracket and the spanning member, and the installation surface and the panel attaching surface respectively facing different directions.

2. The electronic device according to claim 1, wherein the function module further comprises a slidable structure slidably located on the installation surface of the fixed bracket, and the function unit is pivotally connected to the slidable structure.

3. The electronic device according to claim 2, wherein the function module further comprises a guiding rod located on the installation surface of the fixed bracket and disposed through the slidable structure, and an extension direction of the guiding rod is parallel to a slidable direction of the function unit.

4. The electronic device according to claim 3, wherein the function module further comprises an angle-positioning structure extending outwardly from the function unit and comprising a connecting portion and an extension arm portion, the connecting portion is connected to the function unit and the extension arm portion, and the connecting portion, the function unit, and the slidable structure are coaxial.

5. The electronic device according to claim 4, wherein the slidable structure comprises two stopping surfaces which face toward each other, the extension arm portion comprises two contact surfaces located opposite to each other, and one of the contact surfaces selectively presses against one of the stopping surfaces of the slidable structure.

6. The electronic device according to claim 4, wherein the function module further comprises a guiding structure disposed on the installation surface of the fixed bracket and comprising a guiding opening portion and a guiding slot portion connected to each other, and the extension arm portion of the angle-positioning structure comprises an angle-adjusting surface which selectively presses against two inclined guide surfaces which define the guiding opening portion of the guiding structure.

7. The electronic device according to claim 6, wherein the guiding slot portion of the guiding structure is parallel to the extension direction of the guiding rod, the extension arm portion of the angle-positioning structure is selectively and slidably located in the guiding slot portion of the guiding structure.

8. The electronic device according to claim 3, wherein the function module further comprises a gear damper and a toothed rail, the gear damper is disposed on the installation surface of the fixed bracket, the toothed rail comprises a distal portion and a toothed portion connected to each other, the distal portion is pivotally connected to the function unit, the toothed portion is meshed with the gear damper, and an extension direction of the toothed portion is parallel to the extension direction of the guiding rod.

9. The electronic device according to claim 2, wherein the function module further comprises an elastic component connected between the slidable structure and the fixed bracket.

10. The electronic device according to claim 1, wherein the function module further comprises a retainer and a latch, the retainer is disposed on the installation surface of the fixed bracket, and the latch protrudes from the function unit and is releasably engaged with the retainer.

11. The electronic device according to claim 1, further comprising a circuit board module and a cable, wherein the device casing comprises a rear casing member, the circuit board module is disposed on the panel rear side of the display panel module, the cable is electrically connected between the function unit and the circuit board module, and at least part of the cable is selectively located between the rear casing member of the device casing and the circuit board module.

12. The electronic device according to claim 1, wherein the function the spanning member comprises two mount portions and a spanning portion connected between the two mount portions, the spanning member is fixed to the installation surface of the fixed bracket via the two mount portions, the function unit is selectively slidably located between the spanning portion of the spanning member and the installation surface of the fixed bracket, the device casing comprises a rear casing member, and the rear casing member is fixed to the spanning portion of the spanning member.

13. The electronic device according to claim 1, wherein the display panel module comprises a display panel and a panel frame, the display panel is disposed on the device casing via the panel frame, and the fixed bracket of the function module is disposed on the panel frame.

14. A function module for a display panel module, comprising:
   a function unit;
   a fixed bracket having a panel attaching surface and an installation surface; and
   a spanning member, fixed to the installation surface of the fixed bracket;
   the installation surface and the panel attaching surface respectively facing different directions, the fixed bracket being attached to a panel rear side of the display panel module via the panel attaching surface, and the function unit being slidably disposed between the installation surface of the fixed bracket and the spanning member.

15. The function module according to claim 14, further comprising a slidable structure slidably disposed on the installation surface of the fixed bracket and pivotally connected to the function unit.

16. The function module according to claim 15, further comprising a guiding rod located on the installation surface of the fixed bracket and disposed through the slidable structure, and an extension direction of the guiding rod is parallel to a slidable direction of the function unit.

17. The function module according to claim 16, further comprising an angle-positioning structure disposed on the installation surface of the fixed bracket and comprising a connecting portion and an extension arm portion, wherein the connecting portion is connected to the function unit and the extension arm portion, the connecting portion, the function unit, and the slidable structure are coaxial, the extension arm portion comprises two contact surfaces located opposite to each other, the slidable structure comprises two stopping surfaces which face toward each other, and one of the two contact surfaces is selectively located between the two stopping surfaces of the slidable structure.

18. The function module according to claim 17, further comprising a guiding structure disposed on the installation surface of the fixed bracket and comprising a guiding opening portion and a guiding slot portion connected to each other, wherein the extension arm portion of the angle-positioning structure comprises an angle-adjusting surface which selectively presses two inclined guide surfaces which define the guiding opening portion of the guiding structure.

19. The function module according to claim 18, wherein the guiding slot portion of the guiding structure is parallel to the extension direction of the guiding rod, and the extension arm portion of the angle-positioning structure is selectively and slidably located in the guiding slot portion of the guiding structure.

20. The function module according to claim 16, further comprising a gear damper and a toothed rail, wherein the gear damper is disposed on the installation surface of the fixed bracket, the toothed rail comprises a distal portion and a toothed portion connected to each other, the distal portion is pivotally connected to the function unit, the toothed portion is meshed with the gear damper, and an extension direction of the toothed portion is parallel to the extension direction of the guiding rod.

\* \* \* \* \*